United States Patent [19]

Ekin et al.

[11] Patent Number: 5,015,620

[45] Date of Patent: May 14, 1991

[54] HIGH-$T_c$ SUPERCONDUCTOR CONTACT UNIT HAVING LOW INTERFACE RESISTIVITY, AND METHOD OF MAKING

[75] Inventors: John W. Ekin, Boulder, Colo.; Armand J. Panson; Betty A. Blankenship, both of Pittsburgh, Pa.

[73] Assignees: The United States of America as represented by the Secretary of Commerce, Washington, D.C.; Westinghouse Electric Corporation, Pittsburgh, Pa.

[21] Appl. No.: 274,881

[22] Filed: Nov. 22, 1988

Related U.S. Application Data

[63] Continuation-in-part of Ser. No. 117,259, Nov. 6, 1987.

[51] Int. Cl.$^5$ .................. B05D 5/12; C23C 14/34; C23C 14/58
[52] U.S. Cl. ........................ 505/1; 505/706; 505/742; 427/62; 427/125; 204/192.17; 204/192.3; 204/192.32
[58] Field of Search .............. 505/1, 706, 701, 742; 427/62, 63, 125; 357/5, 65; 204/192.17, 192.3, 192.32

[56] References Cited

FOREIGN PATENT DOCUMENTS 58-087884 5/1983 Japan .

OTHER PUBLICATIONS

Tzeng et al., *Appl. Phys. Lett.*, 52 (2), Jan. 11, 1988.
Sugimoto et al., *Jap. J. of Appl. Phys.*, vol. 27, No. 5, May 1988.
Vander Maas et al., *Nature*, vol. 328, Aug. 13, 1987.
Ginley et al., *MRS Conf. on High Tc Superconductors*, Apr. 23-24, 1987, pp. 201-204.
Schiller et al., *Thin Solid Films*, 72 (1980) 313-326.
Applied Physics Letters, vol. 51, No. 11, Sep. 14, 1987, pp. 861-863, Ameridan Institute of Physics, New York, U.S.
X. D. Wu et al.: "Epitaxaial ordering of oxide superconductor thin films on (100)SrTiO3 prepared by pulsed laser evaporation".
Advanced Ceramic Materials—Ceramic Superconductors, vol. 2, No. 3B, Jul. 1987, pp. 388-400, ACerS, Westerville, OH, U.S.
R. W. McCallum et al.: "Problems in the production of YBa2Cu3Ox superconducting wire".

*Primary Examiner*—Norman Morgenstern
*Assistant Examiner*—Margaret Bueker
*Attorney, Agent, or Firm*—Alvin J. Englert; Richard Torczon; Robert E. Harris

[57] ABSTRACT

A high-$T_c$ superconductor contact unit having low interface resistivity is disclosed, as is a method for making the unit. An inert metal is deposited on the surface of the superconductor, which surface is preferably nondegraded, to form a unit with the surface of the superconductor, and where temperatures as high as 500° C. to 700° C. can be tolerated, the unit is oxygen annealed to establish a still lower surface resistivity between the surface of the high-$T_c$ superconductor and the inert metal, including a low surface resistivity of about $10^{-10} \Omega$—cm$^2$ at high-$T_c$ superconductor operating temperatures. The superconductor is a metal-oxide superconductor, and may be rare earth, thallium, or bismuth based.

10 Claims, 2 Drawing Sheets

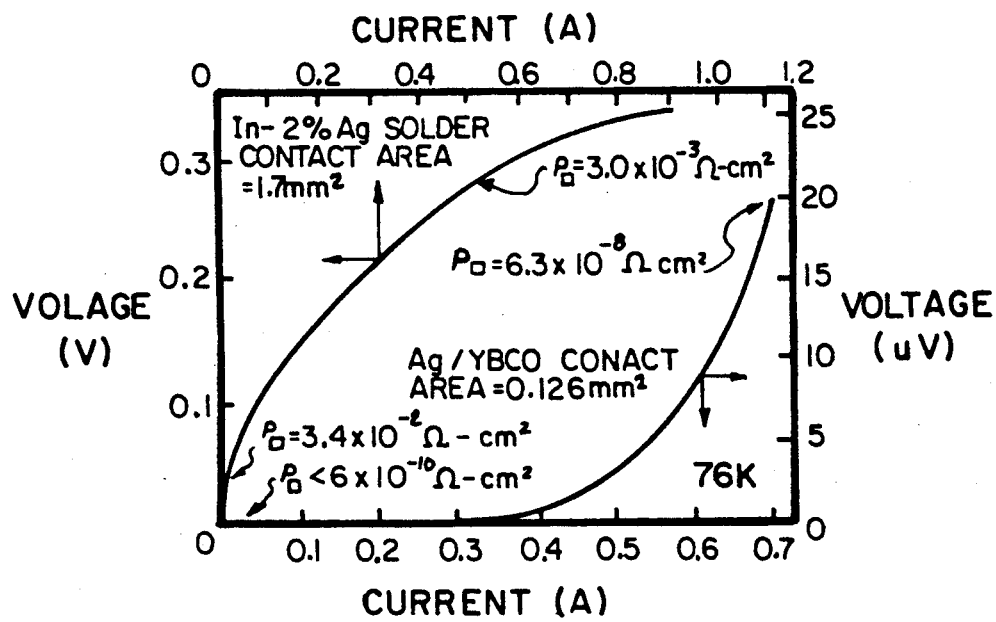
Fig_1
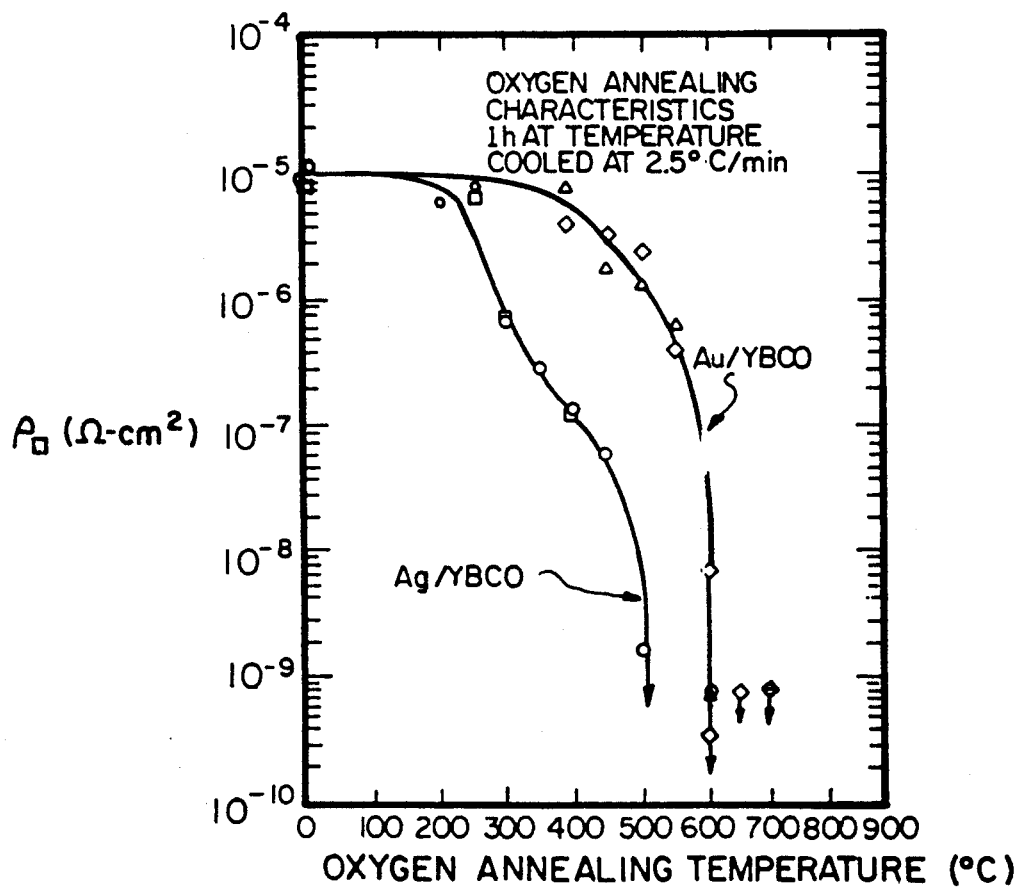
Fig_2

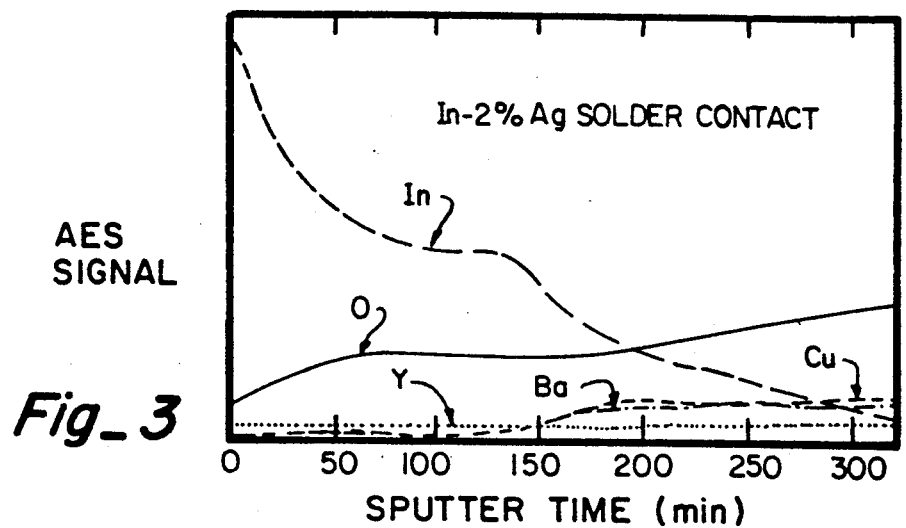
Fig_3
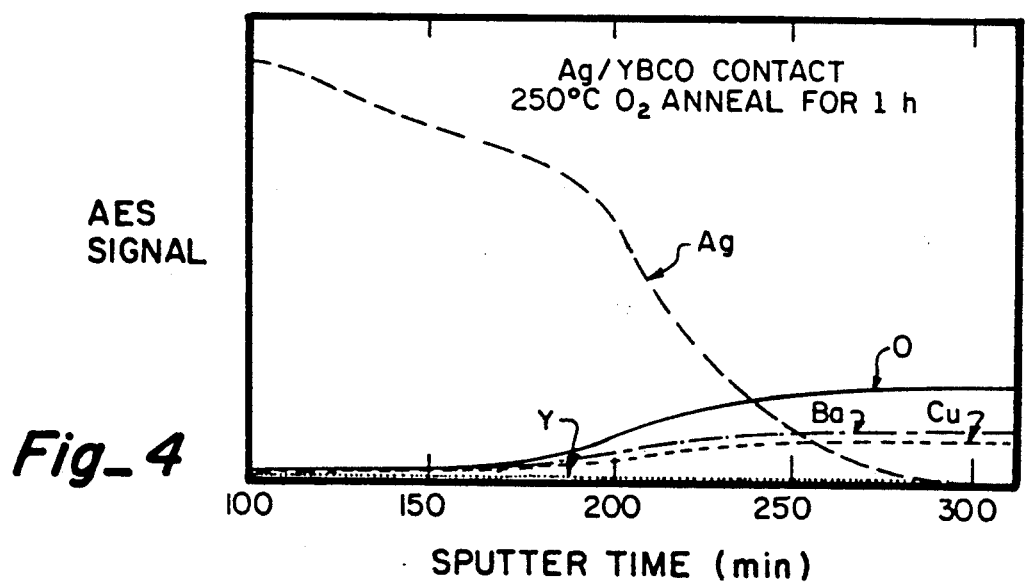
Fig_4
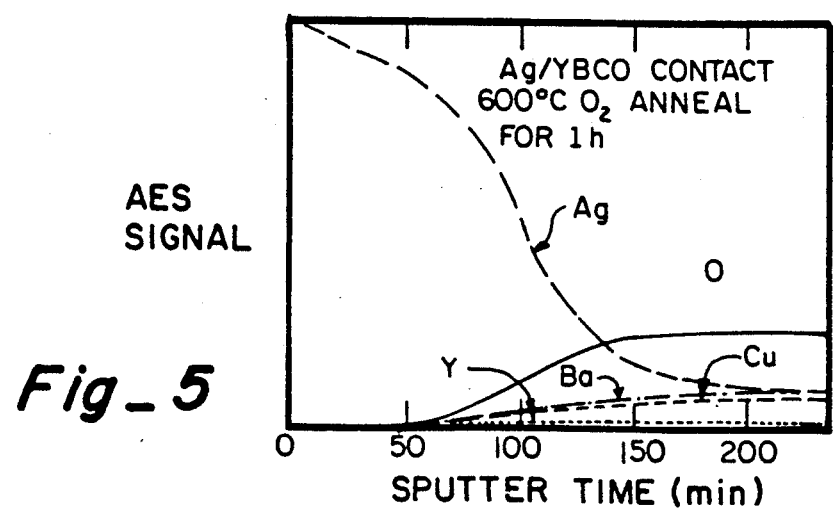
Fig_5

HIGH-$T_c$ SUPERCONDUCTOR CONTACT UNIT HAVING LOW INTERFACE RESISTIVITY, AND METHOD OF MAKING

RELATED APPLICATION

This application is a continuation-in-part of now pending U.S. Pat. application Ser. No. 117,259, filed Nov. 6, 1987, now U.S. Pat. No. 4,963,523.

FIELD OF THE INVENTION

This invention relates to a high-$T_c$ superconductor, and, more particularly, relates to a high-$T_c$ superconductor contact unit having low interface resistivity, and the method for making the same.

BACKGROUND OF THE INVENTION

In superconductors, there is a critical temperature, or $T_c$, at which resistance to the passage of electricity disappears. Conventional superconducting metals, alloys, and compounds, however, have critical temperatures ranging from just above absolute zero to about 15-20 K, and practical applications for such superconductors are therefore limited because they are operative only at extremely low temperatures.

A new class of superconductors, designated high-$T_c$ superconductors, has recently been discovered and is being extensively investigated. The members of this class have much higher critical temperatures making it possible to use them in devices of commerce. One such high-$T_c$ superconductor, a rare-earth based superconductor, $Y_1Ba_2Cu_3O_7$, for example, has a critical temperature of about 93 K. Other rare-earth based superconductors with different rare earth elements substituted for Y have approximately the same $T_c$ and have substantially the same crystal structure. Two new types of high-$T_c$ superconductors with critical temperatures higher than the rare-earth based compounds are bismuth-based high-$T_c$ superconductors (such as $Bi_2Ca_1Sr_2Cu_2O_9$, for example) with critical temperatures up to about 115 K, and thallium-based superconductors ($Tl_2Ca_2Ba_2Cu_3O_x$, for example) with critical temperatures up to about 125 K.

In most commercial applications, superconductors are, or will be, electrically connected to other components of the device containing them. It is essential that the resistivity of the connections be low, particularly where high currents are to be carried, such as, for example, in transmission lines, generators and motors, energy storage devices, and other magnetic applications. Low resistivity connections are also required, for example, for superconductors which are part of an integrated circuit, for example, in high density, high speed computers to reduce the heatloads in such computers.

Low resistivity contacts are especially important for high-$T_c$ superconductors, since even moderate resistance-caused heating can raise the temperature of a superconductor enough to significantly lower its critical-current density. Low resistivity contacts are required for high-$T_c$ superconductors in both bulk applications, such as electromagnets, and in thin-film devices, such as computers.

Contact resistivity is expressed in terms of surface resistivity $\rho\square = RA$, where R is the contact resistance, and A is the contact area. or small magnet applications at liquid nitrogen temperatures, contact resistivities less than about $10^{-5}\Omega-cm^2$ are required to limit heating at the contact to acceptable levels. Contact resistivities less than about $10^{-7}\Omega-cm^2$ are required for integrated circuit package interconnect applications and less than about $10^{-9}\Omega-cm^2$ for on-chip interconnect applications. Low resistivity ohmic contact interfaces such as those described herein are also needed to form superconductor-normal-superconductor junctions, superconductor-normal-semiconductor junctions, as well as other superconducting integrated circuit elements.

Contacts made with indium solder, silver paint, direct wire bonds and pressure contacts have a contact surface resitivity typically in the range $10^{-2}$ to $10\Omega-cm^2$, and such contacts are therefore several orders of magnitude too high for practical applications.

It is known to deposit metals on ceramic components to provide a situs for electrical connections to leads fabricated of copper or other conductive metal. Deposition by sputtering is particularly desirable because the metal deposited strongly adheres to the ceramic substrate. It is known from U.S. Pat. No. 4,337,133 to use sputtered gold as the metal to prepare conductive electrical contact surfaces. It is also known from the paper titled "Metallization of Ceramics For Electronic By Magnetron-Plasmatron Coating" by Schiller et al, appearing in Thin Films, Volume 72, pages 313-326 (1980), that ceramics having silver deposited thereon exhibit good solderability. Various other methods of joining or soldering metals to refractory materials are disclosed in U.S. Pat. Nos. 3,915,369 and 3,993,411.

Typical connecting components in an electrical device or system are made of copper or silver, aluminum, gold-plated conductors, and the like. However, connecting such components to high-$T_c$ superconductors by conventional means such as direct pressure, soldering using flux-containing solders of the type described in U.S. Pat. No. 3,703,254, or even with indium-based solders, results in a relatively high resistivity connection which can adversely affect desirable properties of the superconductor. High resistivity connections can result even if the superconductor contains a metal contact pad.

It has also been heretofore suggested that silver epoxy contacts can be printed on a high-$T_c$ superconductor with the resulting unit then being annealed in streaming oxygen at 900° C. (see "Improved low contact resistance in high-$T_c$ Y-Ba-Cu-O ceramic superconductors" by J. Van der Maas et al., appearing in Nature, Volume 328, pages 603 and 604 (Aug. 1987). In addition, it has been suggested that when silver is evaporative-deposited on a high-$T_c$ superconductor, and then heat treated at 500° C. for up to five hours in an $O_2$ environment, contact resistance is decreased by more than two orders of magnitude (see "High performance silver ohmic contacts to $YBa_2Cu_3O_{6+x}$ superconductors", by Y. Tzeng et al, appearing in Applied Phys. Letters, Volume 52, pages 155 and 156 (Jan., 1988)).

SUMMARY OF THE INVENTION

It has been discovered that an improved low resistivity contact to a high-$T_c$ superconductor is obtained when the contact is made to the preferably non-degraded surface of the superconductor using an inert metal to form a contact unit, and it has been further discovered that the resistivity can be further improved by oxygen annealing the so-formed contact unit.

The high-$T_c$ superconductor is a metal-oxide superconductor and may be rare earth, thallium or bismuth based. An inert metal is a metal that is not readily oxidized, and may be a noble metal, such as gold, platinum, palladium, silver and the like.

The inert metal contact may be a contact pad that protects the superconductor surface from exposure to the air and also provides a situs for attaching external leads. While a connection can be made without first forming a metal contact pad on the surface of the superconductor, the resistivity will be much greater (and can be, for example, many hundred times greater).

A clean or fresh non-degraded surface is provided by abrading the surface of the superconductor. Abrasion of the surface by mechanical means can be utilized, but, unless protective measures are taken, the resulting non-degraded surface is then exposed to media, such as air, which react with the superconductor surface, and this results in high-resistivity, non-ohmic contacts. Therefore, abrasion of the surface of the superconductor by sputter-etching of the surface, without exposure to reactive media prior to deposition, is preferred. When combined with sputter deposition, this results in a strong bond between the deposited metal and the superconductor.

Oxygen annealing is carried out at temperatures of between about 500° C. and 600° C., depending on the inert metal deposited, for a time period of up to about one hour.

For applications where a lead, or leads, are to be connected to the ceramic superconductor, they may be connected to the contact pad, or pads, by soldering or by thermosonic bonding techniques. A low-melting temperature solder which does not readily dissolve noble metal thin films, such as 80% In—15% Pb—5% Ag (melting point 149° C.) or In—3 wt % Ag (melting point 143°) is preferred. Indium solder containing tin should be avoided because it readily dissolves noble metal thin films. The solder utilized is preferably flux-free.

Using this method, contacts have been made which consistently have surface resistivities $\rho_\square$ of about $10^{-5} \Omega - cm^2$ without use of oxygen annealing, and about $10^{-10} \Omega - cm^2$ when oxygen annealing is utilized. This is considerably better than achieved using conventional indium-solder or silver-paint and silver epoxy contacts. Also, the contacts prepared according to the method of the present invention are capable of carrying current loads of several hundred amperes per square cm or greater without apparent degradation, whereas silver paint and silver epoxy contacts, for example, normally burn out at much lower current densities.

In addition, the present contacts do not degrade when exposed to dry air for a period of at least four months. The contact process is carried out at relatively low temperatures and therefore avoids possible degradation of the underlying superconductor, with oxygen annealing being carried out at temperatures of between 500° C. and 600° C. for a relatively short period of time.

It is therefore an object of this invention to enable improved low resistivity electrical connections to high-$T_c$ superconductors.

It is another object of this invention to provide an improved method for making low resistivity connections between the surface of a high-$T_c$ superconductor and an inert metal deposited on the surface of the superconductor.

It is still another object of this invention to enable an improved low resistivity connection to a high-$T_c$ superconductor by depositing an inert metal on the surface of the superconductor to form a unit therewith, and then oxygen annealing the formed unit.

It is yet another object of this invention to provide an improved method for making a low resistivity contact to a high-$T_c$ superconductor which includes forming a noble metal contact pad on the surface of the superconductor, and then oxygen annealing the contact pad/superconductor unit.

It is still another object of this invention to provide a high-$T_c$ superconductor that is a metal-oxide superconductor having a base of rare earth, thallium or bismuth.

With these and other objects in view, which will become apparent to one skilled in the art as the description proceeds, this invention resides in the novel construction, combination, arrangement of parts and method substantially as hereinafter described, and more particularly defined by the appended claims, it being understood that changes in the precise embodiment of the herein disclosed invention are meant to be included as come within the scope of the claims.

BRIEF DESCRIPTION OF THE DRAWINGS

The accompanying drawings illustrate the invention according to the best mode so far devised for the practical application of the principles thereof, and in which:

FIG. 1 is a graphical presentation illustrating voltage-current characteristics at 76 K for indium-solder contacts as contrasted with voltage-current characteristics of noble metal contacts;

FIG. 2 is a graphical presentation illustrating oxygen annealing characteristics for silver and gold contact samples on bulk-sintered YBCO;

FIG. 3 is a graphical presentation illustrating auger electron spectroscopy depth profile for a In—2% Ag solder contact to YBCO;

FIG. 4 is a graphical presentation illustrating auger electron spectroscopy for a Ag/YBCO contact subjected only to a 250° C. oxygen anneal; and FIG. 5 is a graphical presentation illustrating auger electron spectroscopy for a Ag/YBCO contact subject to full oxygen annealing at 600° C. for one hour.

DESCRIPTION OF THE INVENTION

High-$T_c$ superconductors are usually prepared by a procedure which involves firing in an atmosphere of oxygen, as described by Panson et al, Phys. Rev. B35, 8774 (1987). In one embodiment, the method of this invention can be practiced without removing the just prepared high-$T_c$ superconductor from the oxygen atmosphere or vacuum chamber in which it has been prepared.

Without limiting the invention to any theoretical method of operation, it is believed that exposure of a high-$T_c$ superconductor to the atmosphere, i.e., air containing water vapor and carbon dioxide, causes a reaction to take place at the surface of the superconductor which results in an increase in the resistivity of any electrical contact or connection subsequently formed. However, low-resistivity contacts acceptable for many purposes can be prepared if the degraded surface layer is removed or if it is kept from forming in the first place by eliminating exposure of the surface to air or other media that react with the surface of the superconductor.

The metallic contact pad on the high-$T_c$ superconductor is made with an inert metal by depositing or sputtering a thin layer of the metal onto a predetermined portion or portions of the surface of the superconductor. Sputtering is particularly effective in forming a low resistivity contact, because the surface can be sputter etched to remove the degraded surface layer before sputter depositing the contact pad. Also, the sputter deposition process generally results in superior adhesion.

Silver and gold are particularly preferred as contact pad materials since both are inert with strongly positive standard reduction potentials. Silver has the added advantage that its oxides dissociate at a fairly low temperature, and its oxygen diffusion coefficient is fairly high, which allows oxygen permeability at moderate temperatures.

For applications where leads are connected to the contact pad, this is accomplished preferably by soldering with a low melting solder, such as indium or a low melting indium alloy, or by thermosonic bonding techniques. To form a low resistivity connection by soldering, low temperatures and minimum heating times should be utilized.

To avoid the need to abrade the surface of the superconductor or to minimize the amount of abrading required, the surface of the superconductor may be protected from degradation before deposition of the metal contact pad by storage in an inert medium such as a pure oxygen atmosphere free of water vapor and carbon dioxide or in a vacuum. Storage in a conventional laboratory desiccator, for example, is not sufficient.

Where high resistivity contacts can be tolerated, a convenient method to form such a contact is to use indium solder applied directly to the surface of the superconductor. This method, however, results in high contact resistivities typically about $10^{-2} \Omega-cm^2$, and in all cases greater than $10^{-3} \Omega cm^2$.

The best such direct indium contacts were made by using eutectic In—2%Ag solder (without soldering flux), and mechanically abrading the surface under the molten solder with either the tip of the soldering iron or with an ultrasonic soldering iron.

Surface degradation occurred within a very short time—polishing the superconductor surface several seconds before applying the indium solder, for example, did not improve the contact resistivity. These direct indium contact results also showed that, chemically, indium was not a good candidate material for making contacts directly to the superconductor. The resistivity of the contact typically increased more than 50% several days after making the contact.

Indium contacts formed by directly soldering indium to the superconductor without use of a noble metal contact pad (referred to herein as direct indium solder contacts as opposed to noble metal contacts) were semiconducting in character, and FIG. 1 shows the semiconducting character of the voltage-current (V-I) curves for indium solder contacts (negative $d^2V/dI^2$) in contrast to the superconducting character (positive $d^2V/dI^2$) for the noble metal contacts, as set forth (the values of o for the noble-metal contacts correspond to the low current limit). For direct indium solder contacts, the resistivity increased about 3 to 7 times as the temperature was lowered from 295 K to 76 K, and the contacts were also non-ohmic, with the resistivity decreasing as current was increased.

Contacts prepared using the preferred method were metallic in character, with resistivity decreasing 3 to 12 times on cooling from 295 K to 76 K (compare last two columns in Table I).

Forming of contacts on a high-$T_c$ superconductor is further illustrated by means of the following non-limiting examples:

Conventionally prepared bulk-sintered samples of $Y_1Ba_2Cu_3O_7$ were used as the high-$T_c$ superconductor. After firing had been completed, the superconductor was cooled in oxygen, cut into bars 3.2 mm wide by 12 mm long and placed in a sputter vacuum chamber. Total exposure time of the $Y_1Ba_2Cu_3O_7$ to air was about 0.8 hour in Examples 1, 2, 4, 5 and 6 and 2.0 hours in Example 3.

The sputter system utilized for deposit of the metal contact pad was pumped down overnight to a base pressure of about 70$\mu$ Pa. The superconductor surface was sputter etched to a depth of 200 to 500 Å in 3 Pa pressure of argon at 1.25 kV rms. A 1 to 6 $\mu$m thick contact pad was then sputtered onto the $Y_1Ba_2Cu_3O_7$ surface over a 15 to 30 minute period in an argon atmosphere with 4.2 kV rms on the sputter target and no applied bias. The $Y_1Ba_2Cu_3O_7$ sample was held at temperatures less than 100° C. by a water cooled sample holder.

External connections were made to the sputtered silver contact pads in two different ways, first by soldering copper wires to the silver pads as would be appropriate for magnet and other bulk applications (Examples 1 and 3) and by ribbon-bonding fine gold leads appropriate for integrated circuit applications (Examples 2, 4, 5 and 6).

In Examples 1 and 3, the silver pad was indium coated with In—2% Ag solder without the use of a flux. Two wires were soldered to the contact pad, one to carry current and the other to detect voltage at the surface of the pad.

In Examples 2, 4, 5, and 6, fine gold current and voltage leads about 8 $\mu$m $\times$ 80 $\mu$m were attached using a thermosonic ribbon bonder to the contact pad. The temperature of the silver pad was elevated to about 100° C. (higher temperatures, e.g., 150°-200°, could be utilized).

The resistivities of the contacts made by the procedures of Examples 1–6 are summarized in Table I. Data for these samples were obtained using a four terminal technique (to eliminate the large lead-resistance correction that otherwise would have to be applied). Two wires were attached to the current pad, one to carry current, the other to detect voltage at the surface of the pad. The other voltage tap was soldered directly to the superconductor close to the contact pad using indium solder (low contact resistivity was not needed for the voltage detection leads). The room temperature value of the contact resistivity was corrected, where necessary, for the short length of normal $Y_1Ba_2Cu_3O_7$ material between the contact pad and the voltage tap on the superconductor by measuring the resistivity per unit length of superconductor using another voltage tap attached to the superconductor. Accuracy of the contact resistivity measurement was about $\pm 10\%$.

TABLE I

| | Contact Pad* | External Lead Connection | Contact Pad Area, Ac in mm$^2$ | Contact resistance R at 295 K in mΩ | Contact resistance R at 76 K in mΩ | Resistance ratio R (76 K)/ R (295 K) | Surface Resistivity (ρ☐) R (76 K) × A (μΩ-cm$^2$) |
|---|---|---|---|---|---|---|---|
| 1 | 5.9 μm Au | In-2% Ag solder | 31 | 1.4 | 0.60 | 0.43 | 180 |
| 2 | 5.9 μm Au | Au ribbon bond | 0.21 | 39 | 14 | 0.36 | 29 |
| 3 | 1.4 μm Ag | In-2% Ag solder | 14 | 5.5 | 0.44 | 0.08 | 62 |
| 4 | 2.5 μm Ag | Au ribbon bond | 0.07 | 87 | 19 | 0.22 | 13 |
| 5 | 2.5 μm Ag | Au ribbon bond | 0.17 | 30 | 7.9 | 0.26 | 13 |
| 6 | 2.5 μm Ag | Au ribbon bond | 0.06 | 59 | 15 | 0.32 | 9 |

*made by sputter deposition of the indicated inert metal after sputter etching

As shown in the last column of Table I, the lowest contact resistivities were obtained with silver contact pads and wire bonded leads. The contact resistivities for these contacts (Examples 4, 5 and 6 in Table I) were consistently and reproducibly on the order of $10^{-5}$ Ω−cm$^2$, or about three to four orders of magnitude lower than conventional contacts made from indium, silver paint, or pressure contacts. When gold was used for the contact pad (Examples 1 and 2), the contact resistivities were somewhat higher than for silver. This may have resulted from a better bonding of the silver with the $Y_1Ba_2Cu_3O_7$ surface. Contacts with soldered wire leads (Examples 1 and 3) had resistivities that were several times larger than the contacts with wire-bonded leads, but still several orders of magnitude lower than earlier contacts. Alloying of the solder with the thin noble metal pad may have slightly degraded the contact interface. Increasing the thickness of the noble metal pad would keep the indium from alloying completely through the pad and coming in direct contact with the superconductor surface.

When the procedure of the examples was employed with samples exposed to air for about nine weeks, resistivity was about an order of magnitude higher than contacts made with samples exposed to air for about only an hour. Additional sputter etching prior to deposition of the inert metal appears required in those cases where the superconductor has been exposed to air for an extended period of time.

The low resistivity values shown in Table I were unchanged when the role of the current and voltage leads were reversed. With current introduced into the voltage lead and voltage detected using the current lead, the contact resistivities were the same to within 1%. The contact resistivity remained the same for both current directions. Also there was no measurable increase in resistivity with time as current flowed through the contact.

Unlike conventional indium contacts which were semiconducting in character, increasing as the temperature was lowered, the resistivity of the contacts of the present invention were metallic in character, decreasing in resistivity 4 to 12 times on cooling from 295 K to 76 K (see the second last column in Table I).

Contacts made using the method as described herein, unlike conventional indium solder contacts, showed negligible degradation over several months. The contact pads appear to protect the surface of the superconductor from deterioration due to exposure to air. The contact of Example 6, for example, maintained its low resistivity after being stored in dry air for over four months.

A number of contacts have been made using the method as set forth herein with reproducible results. Stability of the contacts with time and use also appears to be excellent. Contacts with low resistivities of about $10^{-5}$Ω−cm$^2$ have been made with the area of the contacts ranging from 0.05 to 31 square millimeters. There is no inherent size limitation and much larger or smaller contact areas can be utilized. The contacts potentially can be photolithographically configured. The contacts showed consistently low resistivity and little degradation when exposed to dry air over a four-month period when repeatedly cycled between room temperature and 76 K.

Modifications of the general method described herein will also result in low contact resistivities. Glow-discharge cleaning and evaporative deposition of noble metals can yield low resistivity contacts, although sputter deposition generally results in superior adhesion.

The method as set forth is applicable to bulk samples, to thin films, and to single crystals of $Y_1Ba_2Cu_3O_x$. It is also applicable to $La_{1.85}Sr_{0.15}CuO_4$ as well as to other metal oxide high-$T_c$ superconductors.

With particular respect to such superconductors, the low temperature (<100° C.) technique described above for YBCO has been found to produce low resistivity contacts to both thallium and bismuth-based high-$T_c$ superconductors. In particular, contact resistivities in the $10^{-6}$ to $10^{-5}$Ω−cm$^2$ range have been achieved with thallium-based high-$T_c$ superconductors and in the $10^{-4}$Ω−cm$^2$ range for bismuth-based high-$T_c$ superconductors.

The method consists of depositing a layer of a noble metal on the oxide superconductor surface and then either wirebonding external leads to the contact pad for small-scale contact applications, or soldering to the pad for high-current applications. The noble metal layer has a low oxygen affinity and does not react with the superconductor; it thus serves as a passivation layer to protect the surface of the superconductor.

It also provides a high conductivity diffusion layer through the hydroxides, carbonates, and nonstoichiometric superconductor material at the surface of the superconductor. Indium contacts soldered directly to oxide superconductors, on the other hand, have what appears to be an indium oxide semiconducting layer several micrometers thick and an interfacial layer of YBCO low in oxygen, which could explain why such contacts are highly resistive and semiconducting in character.

The noble metal contacts were deposited using conventional sputter techniques. Both silver and gold contact pads work well. The surface of the superconductor is preferably cleaned before depositing the noble metal pad (especially for gold contact pads) by using for example, a sputter etching technique as described above.

Results for contacts with several samples of Tl-Ca-Ba-Cu-O high-$T_c$ superconductors are shown in Tables II through IV. Indium soldered directly to the thallium compound had about the same contact surface resistivity at liquid nitrogen temperature as for YBCO ($\sim 10^{-2}\Omega-cm^2$), with resistivity increasing slightly as temperature was lowered to liquid helium temperature. Sputtered Pt contacts produced contacts with resistivities that were only slightly lower in the $10^{-3}\Omega cm^2$ range. Sputtered silver contacts on the other hand were much lower, with contact resistivities in the $10^{-6}$ to $10^{-5}\Omega-cm^2$ range at 76 K, similar to sputtered silver contacts with YBCO.

Results for contacts to a sample of Bi-(Pb-Sr)-Ca-Cu-O high-$T_c$ superconductors are shown in Table V. Sputtered Pt contacts were in the $10^{-4}\Omega-cm^2$ range. Sputtered Ag contacts were also in the $10^{-4}\Omega-cm^2$, about two orders of magnitude higher than for YBCO.

TABLE II

| Contact Resistivities for Tl—Ca—Ba—Cu—O, Sample 1 | | |
| --- | --- | --- |
| | 76 K | 4 K |
| In-2% Ag ultrasonically soldered | $1.2 \times 10^{-2}$ $\Omega$-cm$^2$ | $1.7 \times 10^{-2}$ $\Omega$-cm$^2$ |
| Ag sputtered contacts | $1.1\text{-}1.5 \times 10^{-5}$ $\Omega$-cm$^2$ | |

TABLE III

| Contact Resistivities for Tl—Ca—Ba—Cu—O, Sample 2 | |
| --- | --- |
| | 76 K |
| Pt sputtered contacts | $1.0\text{-}1.1 \times 10^{-3}$ $\Omega$-cm$^2$ |
| Ag sputtered contacts | $1.7 \times 10^{-4}$ $\Omega$-cm$^2$ |

TABLE IV

| Contact Resistivities for Tl—Ca—Ba—Cu—O, Sample 3 | | |
| --- | --- | --- |
| | 76 K | 4 K |
| Pt sputtered contacts | Contacts flaked off | |
| Ag sputtered contacts (wire bond measurement) | $6.4\text{-}9.6 \times 10^{-6}$ $\Omega$-cm$^2$ | |
| Ag sputtered contacts | $6.3\text{-}8.3 \times 10^{-6}$ $\Omega$-cm$^2$ | $6.8\text{-}10.4 \times 10^{-6}$ $\Omega$ cm$^2$ |

TABLE V

| Contact Resistivities for Bi—(Pb—Sr)—Ca—Cu—O | | |
| --- | --- | --- |
| | 76 K | 4 K |
| Pt sputtered contacts | $1.5\text{-}1.6 \times 10^{-4}$ | |
| Ag sputtered contacts | $2.3 \times 10^{-4}$ $\Omega$-cm$^2$ | |
| Ag sputtered contacts | $5.2\text{-}5.3 \times 10^{-4}$ $\Omega$-cm$^2$ | $5.8\text{-}7.4 \times 10^{-4}$ $\Omega$-cm$^2$ |

It should therefore be appreciated that: low temperature (<100° C.) sputtered silver contacts appear to work well for thallium-based high-$T_c$ superconductor compounds, achieving contacts resistivities in the $10^{-6}\Omega-cm^2$ range; low temperature (<100° C.) sputtered silver contacts with contact resistivities in the $10^{-4}\Omega-cm^2$ range have been fabricated for bismuth-based high-$T_c$ superconductor compounds; and, based on these results, low temperature (<100° C.) sputtered noble metal contacts appear to produce low-resistivity contacts ($10^{-4}\Omega-cm^2$ or less) in the oxide superconductors in general.

The contact is preferably attached to a non-degraded surface of the high-$T_c$ superconductor. A nondegraded surface can be achieved by abrading off the degraded surface layer of a superconductor, for example where exposed to reactive media such as air. An alternate approach is to make the contact pad immediately after the ceramic superconductor has been fabricated without exposure to reactive media, or to protect the surface of the superconductor from exposure to air and other reactive media by sealing it in an oxygen atmosphere or an inert atmosphere free from water vapor and carbon dioxide. The freshly prepared ceramic may also be encased or sealed with a gas-impermeable coating fabricated of media which are non-reactive with the ceramic and which can be removed, for example, by sputter-etching.

It has been further found that when intermediate temperatures (500° C. to 700° C.) can be tolerated, oxygen annealing of the contact pad/superconductor unit reduces the resistivities, down to about $10^{-10}\Omega-cm^2$ both for gold and silver contacts. This improved resistivity is obtained by optimizing the oxygen annealing process and by utilizing more sensitive measurement techniques. Different oxygen annealing conditions were found necessary, however, for low resistivity gold-/YBCO and silver/YBCO contacts.

The same starting material of bulk-sintered YBCO was used for all contacts. Bulk-sintered samples of YBCO were used for convenience, but there is no inherent limitation of the contact method that would prevent it's application to thin-films, single crystals, or other high $T_c$ materials. The surface of the superconductor was sputter etched and silver or gold contact pads, 2 to 6 $\mu$m thick, were sputter deposited on the superconductor in argon at a rate of about 1 nm/s. Small contact areas (0.05 to 0.2 mm$^2$) were scribed (to ensure an equipotential surface) and external leads were attached to the noble-metal pads using a thermosonic wire bond technique. Fabrication details, the technique for attaching external leads to the contact pads, and the four-terminal measurement method are described above. All measurements were carried out in liquid nitrogen at 76 K.

FIG. 2 shows the effects of progressively annealing silver and gold contacts (with the underlying superconductor material) in oxygen (the symbols o and □ indicate Ag/YBCO samples, the symbols ∆ and ◊ indicate Au/YBCO samples, and the arrows on the symbols indicate the upper limits of contact resistivity determined by the detecting limits of the measuring system).

The anneal was carried out in flowing oxygen at atmospheric pressure for a period not to exceed about one hour at each temperature indicated. Annealing at times appreciably longer than one hour (for example, eight hours) did not improve $\rho_\square$ (in fact, $\rho_\square$ for Ag-/YBCO was about twice as high after annealing 8 hours compared with annealing only one hour at a given temperature). Following the annealing step, the unit (i.e., the superconductor having the inert metal deposited thereon) was slow cooled in flowing oxygen to room temperature at a rate of about 2.5° C./minute.

The silver pads were about 3 μm thick; the gold pads were about 6 μm thick. Significant reduction in $\rho_\square$ of the gold contacts occurred about 100° C. higher (i.e., at 600° C.) than for silver contacts (i.e., 500° C.). At high enough annealing temperatures (for example 500° C. to 700° C. for silver and 600° C. to 700° C. for gold), the $\rho_\square$ of both silver and gold contacts reached the $10^{-10}\Omega-cm^2$ range (or lower, since only an upper limit could be determined).

The $10^{-10}\Omega-cm^2$ range is an upper bound on $\rho_\square$, limited by the voltage detection sensitivity of the equipment utilized, and the critical current density ($J_c$) of the superconductor. This value of $\rho_{SB}$ is not simply limited by the normal resistivity of the noble metal contact pad. Taking the bulk normal resistivities of silver and gold at liquid nitrogen temperature to be on the order of 2 or $3\times10^{-7}\Omega-cm$, and the thickness of the contact pads in the range of 2 to 6 μm, the contribution of the noble metal to the contact surface resistivity was found to be is about 0.5 to $2\times10^{-12}\Omega-cm^2$. Thus, lower limits on $\rho_\square$ could be in the $10^{-12}\Omega-cm^2$ range.

Silver contact pads were also sputter deposited on five-month old YBCO samples that had not been given any prior sputter etch. $\rho_\square$ was only several times higher than for sputter-etched samples. Silver is very mobile and apparently diffuses through the rare earth carbonate and hydroxides that form at the surface of YBCO after exposure to air.

Auger electron spectroscopy (AES) depth profiling was performed using a scanning Auger microprobe (SAM) operating with an e-beam diameter of 0.2 μm. Sputter depth profiling was performed with a 3 kV Ar+ ion beam and a system pressure of 13 μPa ($1.0\times10^{-7}$ Torr). Data were acquired in N(E) mode (number of counts per energy interval) with a resolution of 0.6%.

The AES depth profile of an In contact in YBCO reveals a significant concentration of oxygen throughout the In layer, as well as In diffusion into the bulk YBCO, as seen in FIG. 3. Thermodynamically, the most favorable reaction for oxygen in indium forms $In_2O_3$, which is a semiconducting oxide with a band gap of 3.5 eV and a resistivity at liquid-nitrogen temperature that is much higher than for pure indium, silver, or gold. These factors explain the poor contact resistivity observed for In/YBCO as well as the semiconducting behavior of the V-I characteristic and the increase in $\rho_\square$ as the sample was cooled.

AES depth profile results for the Ag/YBCO sample that was given only a low temperature (250° C.) oxygen anneal are shown in FIG. 4. The Ag layer was sputter etched at a rate of about 20 nm/min. There was negligible oxygen in the Ag layer, with some interdiffusion between the Ag and YBCO. There appears to be an oxygen deficiency in the YBCO at the contact interface, as evidenced by the increasing oxygen signal into the bulk YBCO material in FIG. 3.

The AES profile of the fully annealed (600° C. for one hour) Ag contact on YBCO (as shown in FIG. 5) reveals significant differences. First, considerable interdiffusion of Ag has occurred, as evidenced by the larger Ag signal in the bulk YBCO. Second, the YBCO material at the Ag/YBCO interface has a significantly higher oxygen signal relative to the Y-Ba-Cu content. Similar AES results were obtained for the gold/YBCO contacts (i.e. diffusion of Au into YBCO, no oxygen in the Au layer, and higher oxygen at the YBCO interface after oxygen annealing at 600° C. for one hour).

The AES depth profile of a thin (2.5 μm) Ag contact, after external leads had been indium soldered to it several times, revealed no buffer of Ag remaining at the YBCO interface. Instead indium contacted the YBCO interface, similar to the depth profile in FIG. 3, indicating that the indium can alloy through the noble metal buffer layer and degrade the superconductor surface where the buffer layer is thin and indium is applied repeatedly.

It has also been found that annealing of contacts formed on other metal oxide high-$T_c$ superconductors can improve contact resistivities. For example, has been found that annealing of such contacts in oxygen at intermediate temperatures (500° C.-700° C.) further reduces the contact resistivities to the $10^{-7}\Omega-cm^2$ range for a thallium-based high-$T_c$ superconductor. In particular, it has been found that annealing the contact and thallium superconductor together in oxygen at 600° C. for one hour in a sealed quartz ampule (initially $10^5$ Pa pressure at room temperature) reduced the contact resistivity about two orders of magnitude to the $10^{-7}\Omega-cm^2$ range (specifically for 76 K to $3\times10^{-7}\Omega-cm^2$). This was a distinct improvement, but not as low as for Ag-/YBCO contacts annealed in flowing oxygen, where the contact resistivity was reduced to the $10^{-10}\Omega-cm^2$ range.

From the foregoing, it appears that: oxygen annealing of silver/YBCO contacts at temperatures above 500° C. for one hour is effective in reducing the contact resistivity more than four orders of magnitude to the $10^{-10}\Omega-cm^2$ range (with gold/YBCO contacts, temperatures above about 600° C. for example between 600° C. and 700° C., for one hour are required for similar resistivity reduction); the Auger microprobe results indicate that the oxygen affinity of the contact material plays an important role (indium has considerable oxygen throughout the indium contact layer and apparently forms a semiconducting layer at the contact interface, whereas, in contrast, there is negligible oxygen in the noble-metal contact pads); when indium solder is repeatedly used to attach external leads to thin silver pads, or when a high temperature soldering iron is used, the indium can alloy through the Ag layer and degrade the YBCO surface (depositing thicker noble metal pads or, preferably, using a solder with a lower melting temperature appropriate for thin silver or gold films should help avoid such degradation); silver contact pads act as a switchable passivation layer (raising the temperature of the contact allows enough oxygen to diffuse through the thin silver pad in a matter of minutes to replenish the oxygen in the YBCO at the contact interface, at room temperature, on the other hand, the diffusion rate of oxygen and air through the silver pad is reduced to a negligible level, protecting the YBCO under the contact pad); the AES profiles show that significant diffusion of silver into the surface of the YBCO occurs, even before annealing (it is believed that this interfacial chemistry for silver explains why almost as low contact resistivity can be obtained when the superconductor is exposed to air for a long time and not given a sputter etch prior to contact deposition); and oxygen annealing sputtered silver contacts on thallium-based high-$T_c$ superconductors for one hour at 600° C. produced contact resistivities in the $10^{-7}\Omega-cm^2$ range.

As can be appreciated from the foregoing, this invention thus provides for improving the surface resistivity between an inert metal and the surface of a high-$T_c$ superconductor having the inert metal deposited thereon.

What is claimed is:

1. A method for making a low surface resistivity contact to a high-$T_c$ oxide superconductive which comprises providing a high-$T_c$ oxide superconductor with at least one surface capable of having an inert metal deposited thereon, ensuring that said surface is in a substantially non-degraded state by subjecting said surface to abrading or etching in a manner such that said surface assumes a substantially non-degraded state or maintaining said surface in said substantially non-degraded state after formation of said high-$T_c$ oxide superconductor, depositing said inert metal on said provided surface while said surface is in said substantially non-degraded state to thereby form a unit with said surface, and annealing said unit with oxygen for a period not exceeding about one hour at temperatures not exceeding about 700° C.

2. The method of claim 1 wherein said method includes utilizing a noble metal as said inert metal.

3. The method of claim 2 wherein said method includes utilizing one of gold and silver as said noble metal.

4. The method of claim 1 wherein said step of etching said surface includes sputter etching of said surface.

5. The method of claim 1 wherein said step of annealing said unit is by exposing said unit to oxygen at a temperature of between about 250° C. and 700° C.

6. The method of claim 1 wherein said method includes slow cooling of said unit in oxygen to room temperature immediately following annealing of said unit with oxygen.

7. The method of claim 1 wherein said provided high-$T_c$ superconductor is one of rare-earth based, thallium-based, and bismuth-based.

8. The method of claim 1 wherein said method includes annealing said unit to establish a surface resistivity down to about $10^{-10} \Omega - cm^2$.

9. A method for making a low surface resistivity contact to a high-$T_c$ oxide superconductor which comprises providing a high-$T_c$ oxide superconductor with at least one surface capable of having an inert metal deposited thereon, depositing said inert metal on said provided surface by at least one of sputter or evaporative deposition to thereby form a unit with said surface, and annealing said unit with oxygen for a period not exceeding about one hour at temperatures not exceeding about 700° C.

10. A method for making a low surface resistivity contact to a high-$T_c$ oxide superconductor which comprises providing a high-$T_c$ oxide superconductor with at least one surface capable of having an inert metal deposited thereon, ensuring that said surface is in a substantially non-degraged state by sputter etching said surface, sputter depositing said inert metal on said surface while said surface is in said substantially non-degraded state to thereby form a unit with said surface, and annealing said unit with oxygen for a period not exceeding about one hour at temperatures not exceeding about 700° C. to thereby establish a surface resistivity between said inert metal and said surface down to about $10^{-10} \Omega - cm^2$.

* * * * *